United States Patent
Lin et al.

(10) Patent No.: US 9,099,199 B2
(45) Date of Patent: Aug. 4, 2015

(54) MEMORY CELL AND MEMORY ARRAY

(75) Inventors: Tzu-Kuei Lin, Chu-Pai (TW);
Hung-Jen Liao, Hsinchu (TW); Jhon Jhy Liaw, Zhudong Township (TW); Yen-Huei Chen, Jhudong Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 651 days.

(21) Appl. No.: 13/420,931

(22) Filed: Mar. 15, 2012

(65) Prior Publication Data

US 2013/0242644 A1  Sep. 19, 2013

(51) Int. Cl.
*G11C 11/00* (2006.01)
*G11C 11/412* (2006.01)

(52) U.S. Cl.
CPC ................... *G11C 11/412* (2013.01)

(58) Field of Classification Search
USPC .......................... 365/154, 174, 205
See application file for complete search history.

(56) References Cited

U.S. PATENT DOCUMENTS

| | | | |
|---|---|---|---|
| 5,526,303 A * | 6/1996 | Okajima | 365/154 |
| 7,405,994 B2 | 7/2008 | Liaw | |
| 7,535,751 B2 | 5/2009 | Huang et al. | |
| 8,009,463 B2 | 8/2011 | Liaw | |
| 2002/0064080 A1 * | 5/2002 | Nii et al. | 365/230.05 |
| 2011/0317477 A1 * | 12/2011 | Liaw | 365/156 |

* cited by examiner

*Primary Examiner* — Han Yang
(74) *Attorney, Agent, or Firm* — Lowe Hauptman & Ham, LLP

(57) ABSTRACT

A memory cell includes a first, second, and third columns of devices. The first column of devices includes a first pull-down transistor, a second pull-down transistor, a first switch, and a second switch. The second column of devices includes a third pull-down transistor, a fourth pull-down transistor, a third switch, and a fourth switch. The third column of devices includes a first pull-up transistor, and a second pull-up transistor. The first pull-up transistor, the first pull-down transistor, and the third pull-down transistor are connected as a first inverter, and the second pull-up transistor, the second pull-down transistor, and the fourth pull-down transistor are connected as a second inverter. The first inverter and the second inverter are cross-coupled. The first switch, the second switch, the third switch, and the fourth switch are coupled with output terminals of the first and second inverters.

27 Claims, 7 Drawing Sheets

MEMORY CELL AND MEMORY ARRAY

BACKGROUND

A Static Random Access Memory (SRAM) is a type of semiconductor memory that uses bi-stable latching circuitry to store data. SRAM is usable to retain data, but remains volatile in the conventional sense that data is eventually lost when the memory is not powered. A SRAM circuit includes a plurality of SRAM memory cells. Typically, a SRAM cell includes a pair of switches or pass-gate transistors, through which a datum may be read from or written into the SRAM cell, which is referred to as a single port SRAM cell. Another type of SRAM cell is referred to as a dual port SRAM cell, which includes two pairs of switches or pass-gate transistors. The datum stored in the dual port SRAM cell may be read by two different circuits using different ports (i.e., two different pairs of switches) simultaneously. Also, for dual port SRAM cells sharing the same bit lines, while reading the datum stored in one of the dual port SRAM cells using a first port, another one of the dual port SRAM cells can be accessed using a second port.

DESCRIPTION OF THE DRAWINGS

One or more embodiments are illustrated by way of examples, and not by limitation, in the figures of the accompanying drawings, wherein elements having the same reference numeral designations represent like elements throughout and wherein.

DETAILED DESCRIPTION

Figure 1:
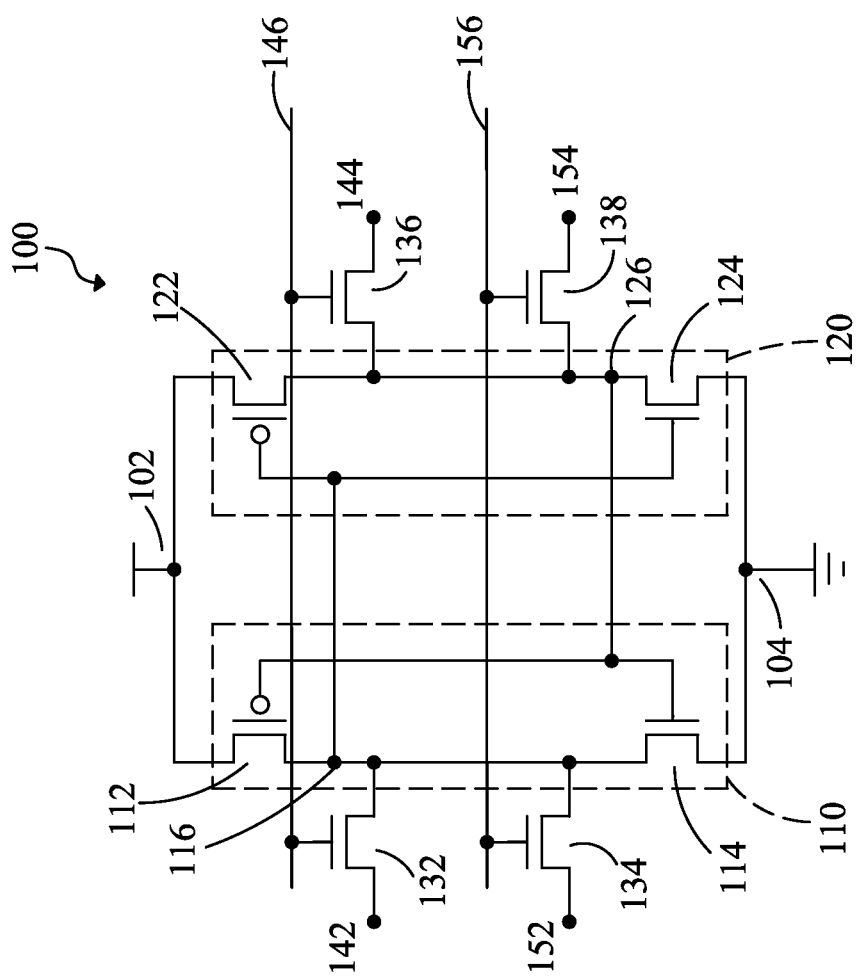
FIG. 1 is a schematic diagram of a dual port memory cell in accordance with one or more embodiments.

It is understood that the following disclosure provides many different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

A dual port SRAM cell has two switches and one word line for a first port and another two switches and another word line for a second port. Compared with a single port SRAM cell, the additional two switches enlarge the size a memory cell occupies, which, in turn, increases the parasitic capacitance and resistance of the word lines. Also, the additional word line limits the line width of each word line, which, in turn, increases the parasitic resistance of the word lines. Therefore, the arrangement of the switches and other electrical components in a dual port SRAM cell affects the performance of a memory circuit built based on the dual port SRAM cell.

In accordance with some embodiments, a memory cell includes a first, second, and third columns of devices. The first column of devices includes a first pull-down transistor, a second pull-down transistor, a first switch, and a second switch. The second column of devices includes a third pull-down transistor, a fourth pull-down transistor, a third switch, and a fourth switch. The third column of devices includes a first pull-up transistor, and a second pull-up transistor. The first pull-up transistor, the first pull-down transistor, and the third pull-down transistor are connected as a first inverter, and the second pull-up transistor, the second pull-down transistor, and the fourth pull-down transistor are connected as a second inverter. The first inverter and the second inverter are cross-coupled. The first switch, the second switch, the third switch, and the fourth switch are coupled with output terminals of the first and second inverters.

FIG. 1 is a schematic diagram of a dual port memory cell (also referred to as a "memory cell") 100 that is usable in a SRAM circuit in accordance with one or more embodiments. The memory cell 100 includes a first power node 102, a second power node 104, a first inverter 110 between the power nodes 102 and 104, a second inverter 120 between the power nodes 102 and 104, and four switches 132, 134, 136, and 138. The first inverter 110 has a pull-up transistor 112 and a pull-down transistor 114, and the drain terminals of the pull-up transistor 112 and the pull-down transistor 114 are connected together to define an output terminal 116 of the first inverter 110. The second inverter 120 has a pull-up transistor 122 and a pull-down transistor 124, and the drain terminals of the pull-up transistor 122 and the pull-down transistor 124 are connected together to define an output terminal 126 of the second inverter 120. The source terminals of the pull-up transistors 112 and 122 are coupled to the power node 102, and the source terminals of the pull-down transistors 114 and 124 are coupled to the power node 104.

The first inverter 110 and the second inverter 120 are cross-coupled inverters. In other words, the gate terminals of the pull-up transistor 112 and the pull-down transistor 114 are connected to the output terminal 126 of the second inverter 120, and the gate terminals of the pull-up transistor 122 and the pull-down transistor 124 are connected to the output terminal 116 of the first inverter 110.

The switch 132 is coupled between a first data node 142 and the output terminal 116 of the first inverter 110, and the switch 136 is coupled between a first complementary data node 144 and the output terminal 126 of the second inverter 120. The switches 132 and 136 work as open or closed circuits in response to a signal on a word line 146 of a first port. The switch 134 is coupled between a second data node 152 and the output terminal 116 of the first inverter 110, and the switch 138 is coupled between a second complementary data node 154 and the output terminal 126 of the second inverter 120. The switches 134 and 138 work as open or closed circuits in response to a signal on a word line 156 of a second port.

Figure 2A:
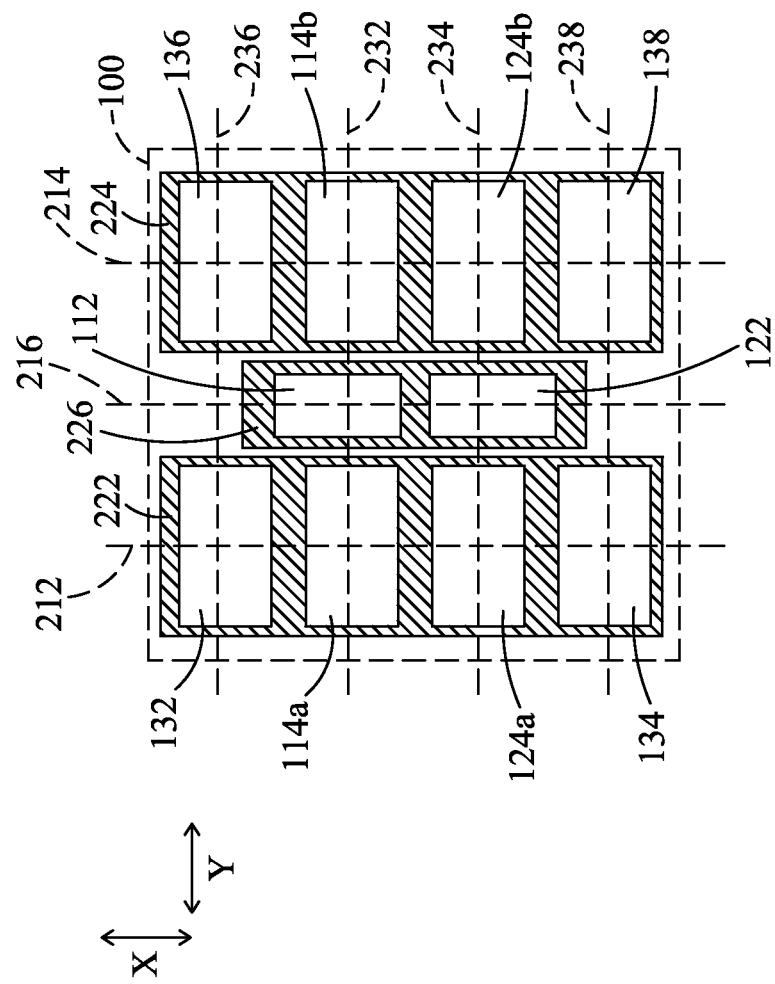
FIG. 2A is a layout planning diagram of various components of a dual port memory cell in accordance with one or more embodiments.
Figure 2B:
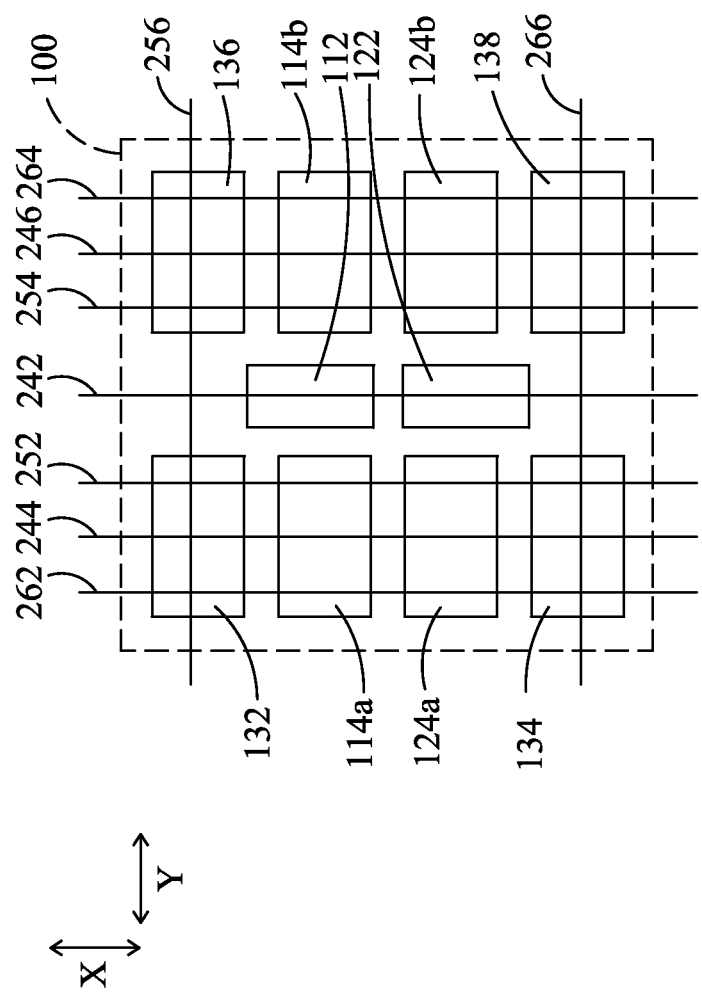
FIG. 2B is a layout planning diagram of various interconnection routes in conjunction with the components of the dual port memory cell in FIG. 2A in accordance with one or more embodiments.

In some embodiments, the first data node 142 is coupled to a bit line (FIG. 2B depicts a data line 252 corresponding to the bit line) of the first port, and the first complementary data node 144 is coupled to a complementary bit line (such as data line 254 in FIG. 2B) of the first port. In some embodiments, the second data node 152 is coupled to a bit line (such as data line 262 in FIG. 2B) of the second port, and the second complementary data node 154 is coupled to a complementary bit line (such as data line 264 in FIG. 2B) of the second port.

In some embodiments, each transistor, such as the pull-up transistor 112, the pull-up transistor 122, the pull-down transistor 114, and the pull-down transistor 124, is implemented by a single transistor device or two or more parallel connected transistor devices.

In some embodiments, the first power node 102 is coupled to a positive voltage source having a first supply voltage level, and the second power node 104 is coupled to a negative voltage source or ground having a second supply voltage level less than the first supply voltage level.

FIG. 2A is a layout planning diagram of various components of a dual port memory cell 100 in accordance with one or more embodiments. To implement the memory cell 100 depicted in FIG. 1, two pull-down transistors 114a and 114b collectively work as the pull-down transistor 114 (FIG. 1), and two pull-down transistors 124a and 124b collectively work as the pull-down transistor 124 (FIG. 1). The pull-down transistors 114a and 124a and the switches 132 and 134 are aligned as a first column 212 of devices along a column direction X. The pull-down transistors 114b and 124b and the switches 136 and 138 are aligned as a second column 214 of devices along the column direction X. The pull-up transistors 112 and 122 are aligned as a third column 216 of devices along the column direction X. The third column 216 of devices is between the first column 212 of devices and the second column 214 of devices. In some embodiments, the order of the columns 212, 214, and 216 are swappable. For example, in at least one embodiment, the first column 222 is between the second column 224 and the third column 226; and in at least one other embodiment, the second column 224 is between the first column 222 and the third column 226.

The memory cell 100 is formed on a substrate (310 in FIG. 3A), where the transistors 112, 122, 114a, 114b, 124a, and 124b and switches 132, 134, 136, and 138 are formed at active regions of the substrate. As depicted in FIG. 2A, the substrate has three active regions 222, 224, and 226. The pull-down transistors 114a and 124a and the switches 132 and 134 are positioned at a first active region 222, the pull-down transistors 114b and 124b and switches 136 and 138 are positioned at a second active region 224, and the pull-up transistors 112 and 122 are positioned at a third active region 226.

In some embodiments, the pull-down transistors 114a, 114b, 124a, and 124b and switches 132, 134, 136, and 138 are N-type metal-oxide semiconductor field effect transistors (MOSFETs, or MOS transistors), and the first active region 222 and the second active region 224 are P-well regions in the substrate. In some embodiments, the pull-up transistors 112 and 122 are P-type MOS transistors, and the third active region 226 is an N-well region in the substrate.

As depicted in FIG. 1 and FIG. 2A, the pull-up transistor 112 and the pull-down transistors 114a and 114b are connected to form the first inverter 110, and the pull-up transistor 122 and the pull-down transistors 124a and 124b are connected to form the second inverter 120.

The pull-up transistor 112 and the pull-down transistors 114a and 114b are arranged as a first row 232 of devices along a row direction Y. The pull-up transistor 122 and the pull-down transistors 124a and 124b are arranged as a second row 234 of devices along the row direction Y. The switches 132 and 136 are arranged as a third row 236 of devices along the row direction Y, and the switches 134 and 138 are arranged as a fourth row 238 of devices along the row direction Y.

In some embodiments, the switches 132, 134, 136, and 138 are arranged to respectively couple (1) the first output terminal 116 with the first data node 142; (2) the first output terminal 116 with the second data node 152; (3) the second output terminal 126 with the first complementary data node 144; and (4) the second output terminal 126 with the second complementary data node 154.

FIG. 2B is a layout planning diagram of various interconnection routes in conjunction with the components of the dual port memory cell 100 in accordance with one or more embodiments. The memory cell 100 includes a first power line 242, a second power line 244, and a third power line 246. The memory cell 100 also includes a first data line 252, a first complementary data line 254, a first word line 256, a second data line 262, a second complementary data line 264, and a second word line 266.

The first power line 242 is positioned along the column direction X and over the pull-up transistors 112 and 122. In at least one embodiment, the first power line 242 is electrically coupled to the first power node 102 (FIG. 1). The second power line 244 and the third power line 246 are positioned along the column direction X. The second power line 244 is over the pull-down transistors 114a and 124a and the switches 132 and 134. The third power line 246 is over the pull-down transistors 114b and 124b and the switches 136 and 138. In at least one embodiment, the second power line 244 and the third power line 246 are electrically coupled to the second power node 104 (FIG. 1).

The first data line 252 and the first complementary data line 254 are positioned along the column direction X. The first data line 252 is between the first power line 242 and the second power line 244, and the first complementary data line 254 is between the first power line 242 and the third power line 246. In at least one embodiment, the first data line 252 is electrically coupled to the first data node 142 as the bit line of the first port, and the first complementary data line 254 is electrically coupled to the first complementary data node 144 as the complementary bit line of the first port.

The second data line 262 and the second complementary data line 264 are also positioned along the column direction X. The second power line 244 is between the second data line 262 and the first data line 252, and the third power line 246 is between the second complementary data line 264 and the first complementary data line 254. In at least one embodiment, the second data line 262 is electrically coupled to the second data node 152 as the bit line of the second port, and the second complementary data line 264 is electrically coupled to the second complementary data node 154 as the complementary bit line of the second port.

In some embodiments, the position of the power lines 244 and 246 and the data lines 252, 262, 254, and 264 are swappable. For example, in some embodiments, the second data line 262 is between the second power line 244 and the first data line 252, and the second complementary data line 264 is between the third power line 246 and the first complementary data line 254. In at least one embodiment, the second data line 262 is electrically coupled to the first complementary data node 144 as the complementary bit line of the first port, and the first complementary data line 254 is electrically coupled to the second data node 152 as the bit line of the second port.

In some embodiments, one or more of the power lines 242, 244, and 246 are selectively omitted.

The first word line 256 is along the row direction Y and over the switches 132 and 136. In at least one embodiment, the first word line 256 is usable as the word line 146 (FIG. 1) of the first port. The second word line 266 is along the row direction Y and over the switches 134 and 138. In at least one embodiment, the second word line 266 is usable as the word line 156 (FIG. 1) of the second port.

In some embodiments, compared with a memory cell having four or more columns of devices, the three-column configuration of the memory cell 100, as depicted in FIGS. 2A and 2B, shortens the length of the word lines 256 and 266 of the memory cell 100 along the row direction Y and widens the spacing for adjusting widths of the word lines 256 and 266 along the column direction X. Therefore, the layout of the word lines 256 and 266 is sufficiently flexible to meet various application requirements for the parasitic resistance and capacitance of the word lines 256 and 266.

Figure 2C:
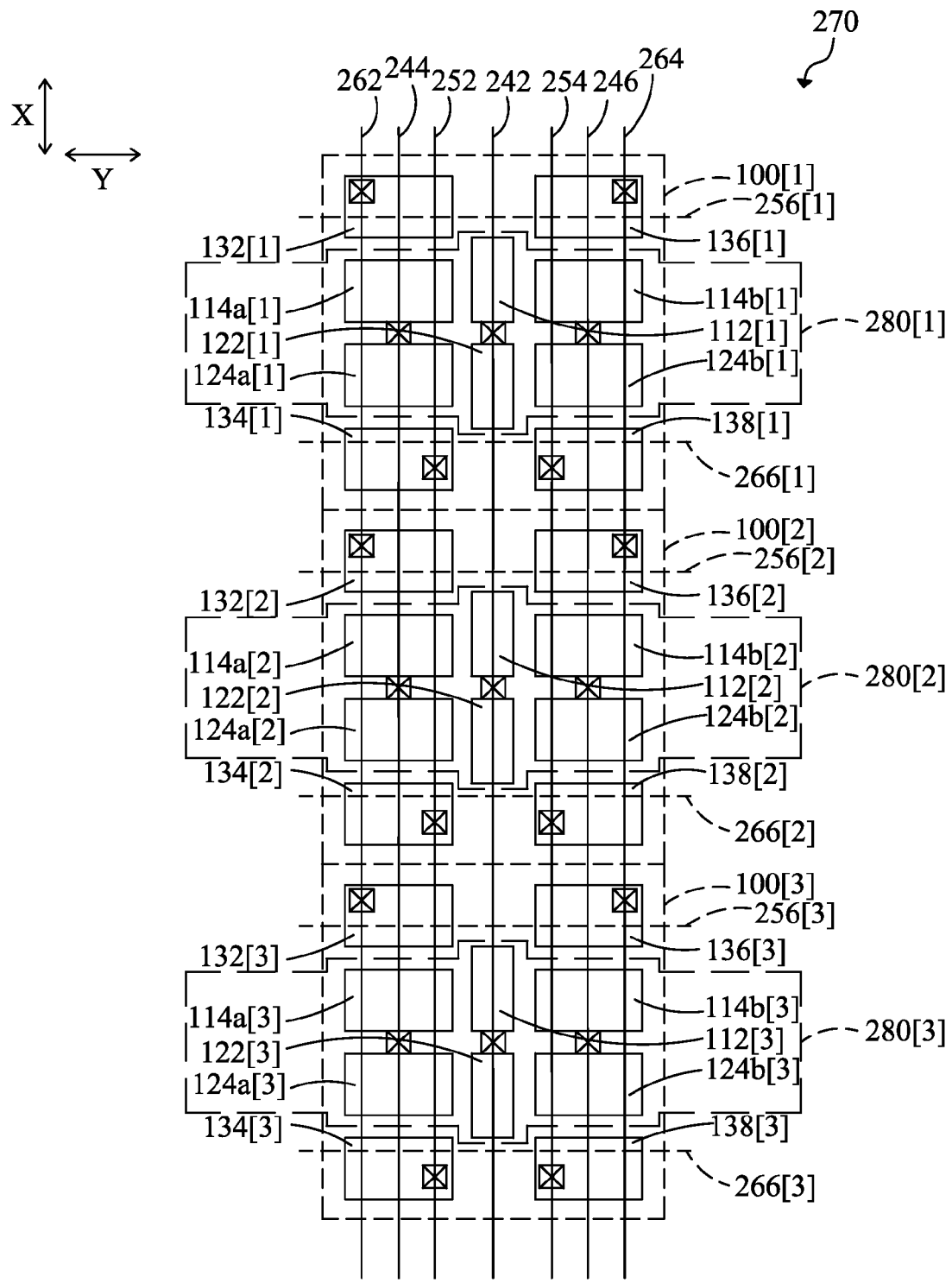
FIG. 2C is a layout planning diagram of various components in a column of memory cells of a memory array in accordance with one or more embodiments.

FIG. 2C is a layout planning diagram of various components in a column 270 of memory cells 100[1], 100[2], and 100[3] of a memory array in accordance with one or more embodiments. Although only three memory cells 100[1], 100[2], and 100[3] are depicted in FIG. 2C, in some embodiments, the column 270 of the memory array has more or less than three memory cells. In some embodiments, the column 270 of the memory array has from 16 to 2048 memory cells. In some embodiments, the memory array has more than one column 270 of memory cells. In at least one embodiment, the memory array has from 16 to 2048 columns of memory cells.

The memory cells 100[1], 100[2], and 100[3] have transistors 112[1-3], 122[1-3], 114a[1-3], 114b[1-3], 124a[1-3], and 124b[1-3] and switches 132[1-3], 134[1-3], 136[1-3], and 138[1:3], which are the same or similar to the transistors 112, 122, 114a, 114b, 124a, and 124b and switches 132, 134, 136, and 138 of the memory cell 100. The notation "[1-3]" refers to "[1]," "[2]," and "[3]" for indicating the corresponding components in memory cells 100[1], 100[2], and 100[3]. For example, "112[1-3]" refers to 112[1], 112[2], and 112[3]. The memory cells 100[1], 100[2], and 100[3] also have word lines 256[1-3] and 266[1-3], which are the same or similar to the word lines 256 and 266 of the memory cell 100 depicted in FIGS. 2A and 2B. Therefore, detailed descriptions regarding the memory cells 100[1], 100[2], and 100[3] are omitted.

As depicted in FIG. 2C and FIG. 1, each memory cell 100[1], 100[2], or 100[3] has a pair of cross-coupled inverters 110 and 120 (including transistors 112[1-3], 122[1-3], 114a[1-3], 114b[1-3], 124a[1-3], and 124b[1-3] and collectively identified as 280[1:3] in FIG. 2C) having a first output terminal 116 and a second output terminal 126. For each memory cell 100[1], 100[2], or 100[3], a first switch 132[1-3] is on a first side, along the column direction X, of the pair of cross-coupled inverters 280[1-3] and electrically coupled to the corresponding first output terminal 116. A second switch 134[1-3] is aligned with the first switch 132[1-3] along the column direction X, on a second side of the pair of cross-coupled inverters 280[1-3] opposite to the first side, and electrically coupled to the corresponding first output terminal 116. For each memory cell 100[1], 100[2], or 100[3], a third switch 136[1-3] is on the first side of the pair of cross-coupled inverters 280[1:3] and electrically coupled to the corresponding second output terminal 126, and a fourth switch 138[1-3] is aligned with the third switch 136[1-3] along the column direction X, on the second side of the pair of cross-coupled inverters 280[1-3], and electrically coupled to the corresponding second output terminal 126.

In some embodiments, the connection among the switches 132[1-3], 134[1-3], 136[1-3], and 138[1-3] and the corresponding first output terminals 116 and second output terminals 126 of the memory cell 100[1], 100[2], and 100[3] is not limited to the example embodiment of FIG. 2C. In some embodiments, each of the switches 132[1-3], 134[1-3], 136 [1-3], and 138[1-3] is electrically coupled to either the corresponding first output terminal 116 or the corresponding second output terminal 126.

The column 270 of memory cells also includes a first power line 242, a second power line 244, a third power line 246, a first data line 252, a first complementary data line 254, first word lines 256[1-3], a second data line 262, a second complementary data line 264, and second word line 266[1-3], which are the same or similar to their counterparts depicted in FIG. 2B. Therefore, descriptions regarding the lines 242, 244, 246, 252, 254, 256[1-3], 262, 264, and 266[1-3] are omitted.

As depicted in FIG. 2C, the connection among the first data line 252 and the second data line 262 with the switches 132[1-3] and 134[1-3] are different between two adjacent memory cells 100[1] and 100[2] or 100[2] and 100[3]. Also, the connection among the first complementary data line 254 and the second complementary data line 264 with the switches 134[1-3] and 138[1-3] are different between two adjacent memory cells 100[1] and 100[2] or 100[2] and 100 [3]. Therefore, the workload of the first port and the second port of the memory cells 100[1-3] is distributed among data lines 252, 254, 262, and 264 without physically twisting the data lines 252, 254, 262, and 264.

For example, the first data line 252 is electrically coupled to the first switch 132[1] of the first memory cell 100[1] and the second switch 134[2] of the second memory cell 100[2]. The first complementary data line 254 is electrically coupled to the third switch 136[1] of the first memory cell 100[1] and the fourth switch 138[2] of the second memory cell 100[2]. The second data line 262 is electrically coupled to the second switch 134[1] of the first memory cell 100[1] and the first switch 132 [2] of the second memory cell 100[2]. The second complementary data line 264 is electrically coupled to the fourth switch 138[1] of the first memory cell 100[1] and the third switch 136[2] of the second memory cell 100[2]. In addition, the connections among the data lines 252, 254, 262, and 264 and the switches 132[3], 134[3], 136[3], and 138[3] of the memory cell 100[3] is the same as that of the memory cell 100[1].

Figure 3A:
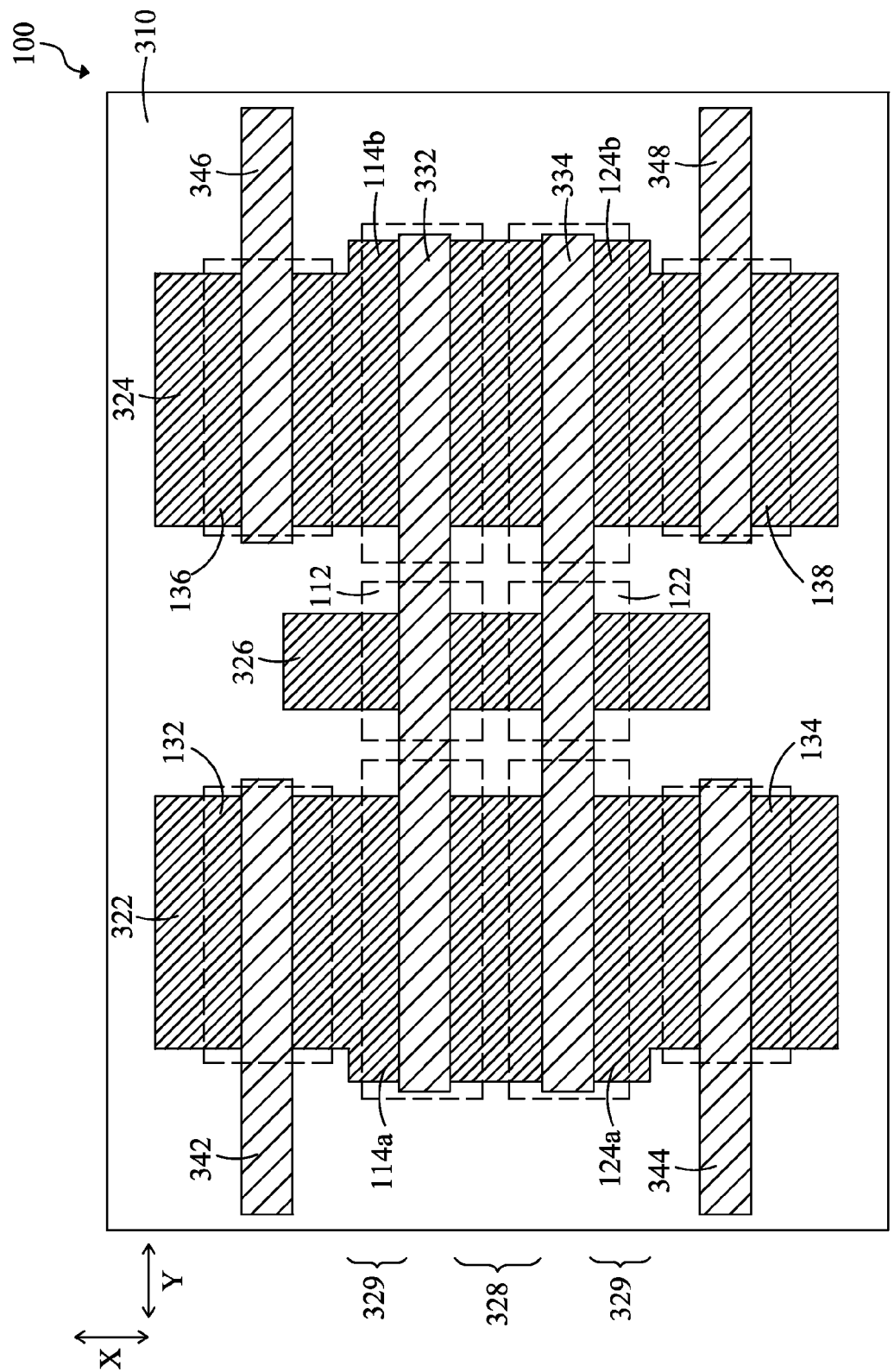
FIGS. 3A-3C are layout diagrams of a dual port memory cell depicted with various number of layers of interconnection structure in accordance with one or more embodiments.

FIG. 3A is a layout diagram of a dual port memory cell 100 including the substrate 310, the patterns for active regions 322, 324, and 326 and gate electrodes 332, 334, 342, 344, 346, and 348 in accordance with one or more embodiments. The memory cell 100 is formed on the substrate 310, and the substrate 310 includes a first active region 322, a second active region 324, and a third active region 326.

The pull-down transistors 114a and 124a and the switches 132 and 134 are positioned at the first active region 322 and aligned along a column direction X. The pull-down transistors 114b and 124b and the switches 136 and 138 are positioned at the second active region 324 and aligned along the column direction X. The pull-up transistors 112 and 114 are positioned at the third active region 326. The gate electrode 332 is used as gate terminals for the transistors 112, 114a, and 114b, and the pull-up transistor 112 and the pull-down transistors 114a and 114b are connected as a first inverter 110 (FIG. 1). The gate electrode 334 is used as gate terminals for the transistors 122, 124a, and 124b, and the pull-up transistor 122 and the pull-down transistors 124a and 124b are connected as a second inverter 120 (FIG. 1). The switches 132, 134, 136, and 138 are MOS transistors, and the gate electrodes 342, 344, 346, and 348 are used as the gate terminals of the switches 132, 134, 136, and 138.

In at least one embodiment, the pull-up transistors 112 and 122 are P-type MOS transistors, and the pull-down transistors 114a, 114b, 124a, and 124b and switches 132, 134, 136, and 138 are N-type MOS transistors. In at least one embodiment, an inner portion 328 of each active region 322, 324, and 326 between the gate electrodes 332 and 334 forms source terminals of the transistors 112, 122, 114a, 114b, 124a, and 124b. Also, in at least one embodiments, an outer portion 329 of each active regions 322, 324, and 326 on the opposite sides of the gate electrodes 332 and 334 facing the switches 132, 134, 136, and 138 forms drain terminals of the transistors 112, 122, 114a, 114b, 124a, and 124b.

In some embodiments, the active regions 322, 324, and 326 have any size and shape. In some embodiments, the active regions 322, 324, and 326 are rectangular. In some embodiments, the active regions 322, 324, and 326 have variable widths that are sufficient to form predetermined gate widths for transistors and switches 112, 122, 114a, 114b, 124a, 124, 132, 134, 136, and/or 138.

Figure 3B:
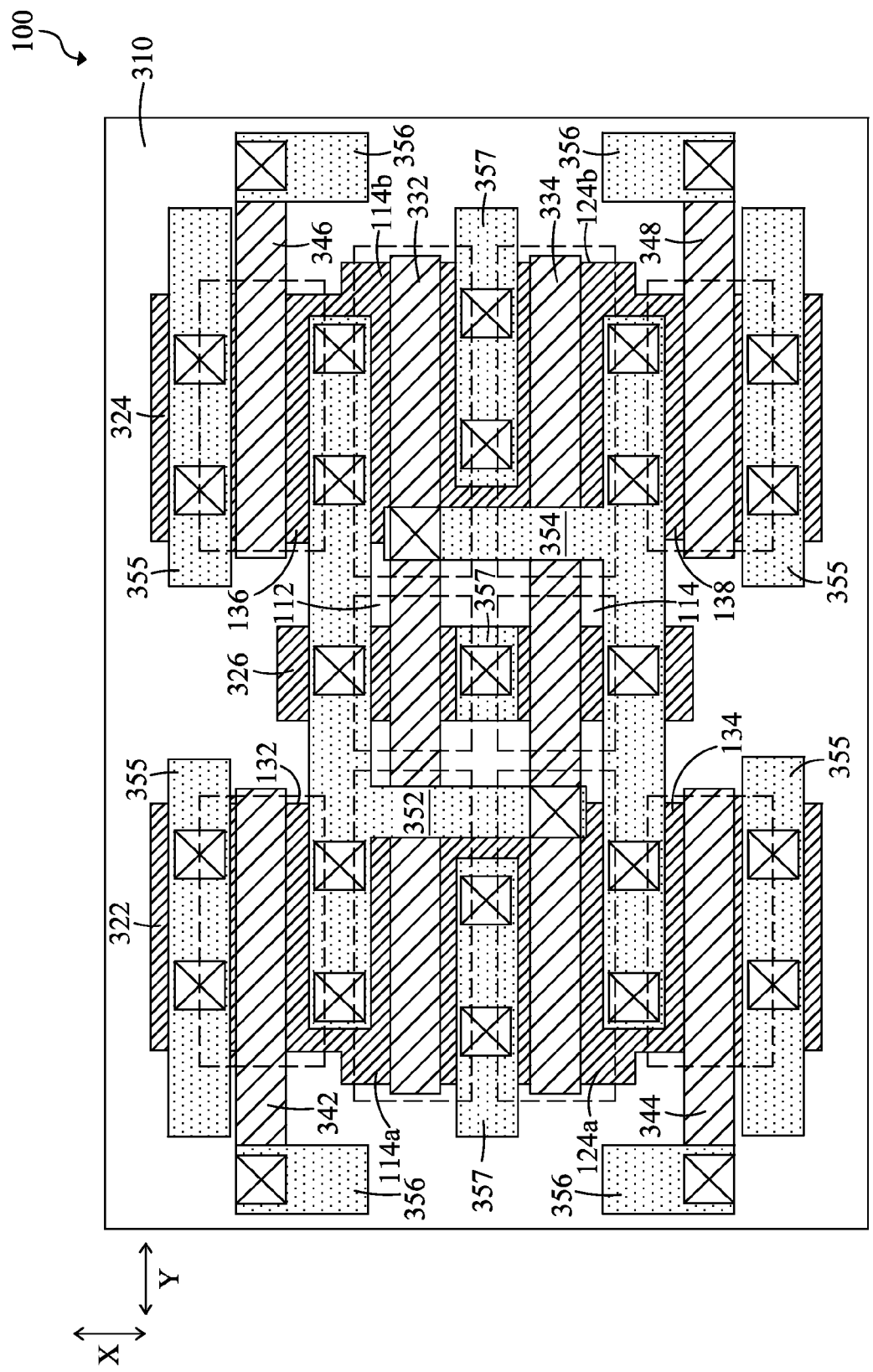

FIG. 3B is a layout diagram of the dual port memory cell 100 as depicted in FIG. 3A with the addition of patterns of conductive lines 352, 354, 355, 356, and 357 that forms a first layer of interconnection structure over the transistors 112, 114a, 114b 122, 124a, and 124b and switches 132, 134, 136, and 138 of the memory cell 100. Conductive line 352 connects the drain terminals of the transistors 112, 114a, and 114b with the gate electrode 334, and the conductive line 354 connects the drain terminals of the transistors 122, 124a, and 124b with the gate electrode 332. Therefore, transistors 112, 114a, and 114b are connected as a first inverter 110 having conductive line 352 as an output terminal, and transistors 122, 124a, and 124b are reconnected as a second inverter 120 having conductive line 354 as an output terminal. Also, the inverters 110 and 120 are cross-coupled by the conductive lines 352 and 354. In addition, conductive line 352 is electrically coupled to drain/source terminals of switches 132 and 134, and conductive line 352 is electrically coupled to drain/source terminals of switches 136 and 138. Conductive lines 355, 356, and 357 are usable to electrically couple various features underneath with other interconnection structures to be formed over the conductive lines 352, 354, 355, 356, and 357.

Figure 3C:
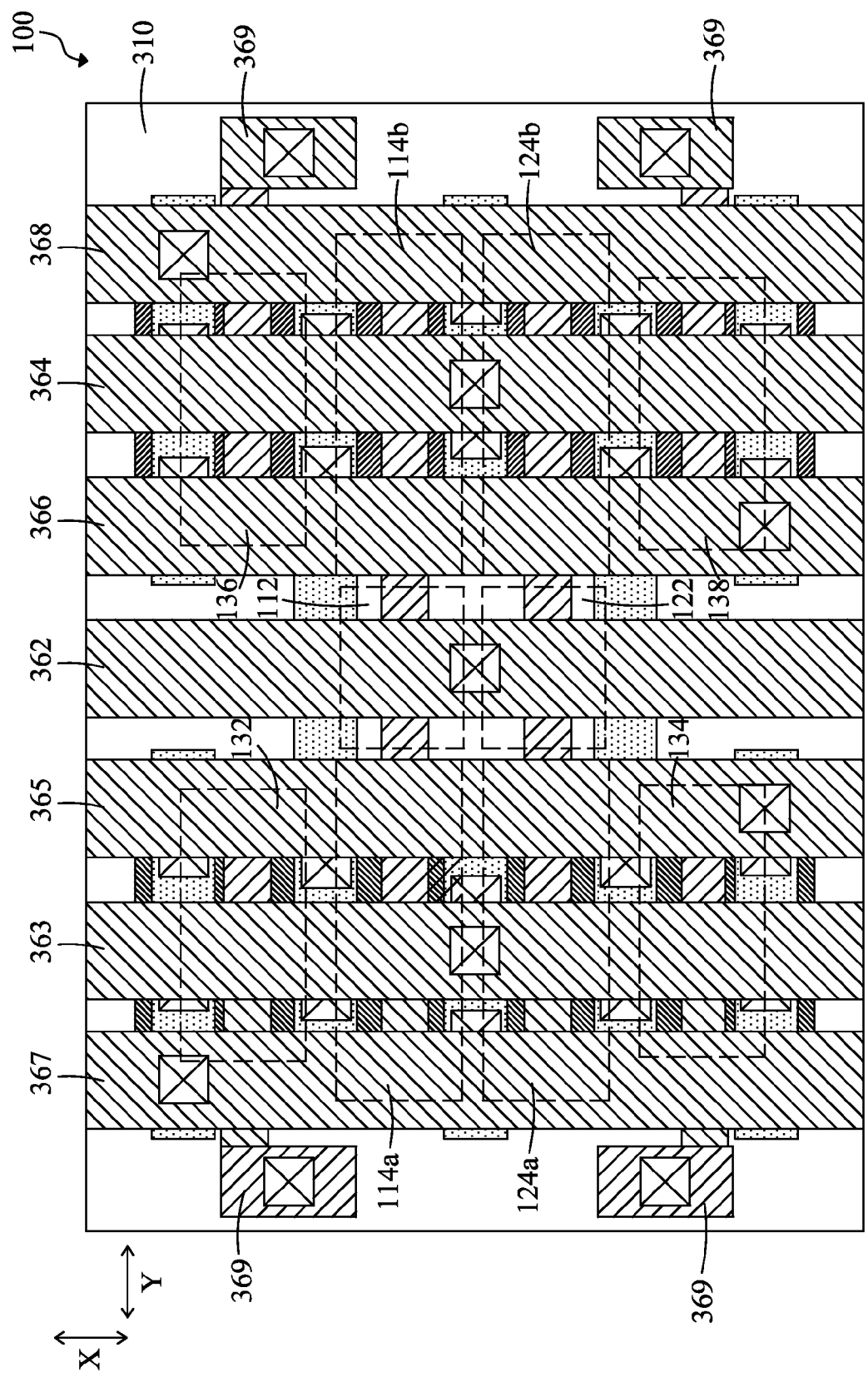

FIG. 3C is a layout diagram of the dual port memory cell 100 as depicted in FIG. 3B with the addition of patterns of conductive lines 362, 363, 364, 365, 366, 367, 368, and 369 that forms a second layer of interconnection structure over the first layer of interconnection structure. The conductive lines 362, 363, 364, 365, 366, 367, 368, and 369 are arranged along the column direction X.

As depicted in FIG. 3C and FIG. 2B, the conductive line 362 is usable as the first power line 242, the conductive line 363 is usable as the second power line 244, and conductive line 364 is usable as the third power line 246. The conductive line 362 is electrically coupled to the source terminals of the transistors 112 and 122. The conductive line 363 is electrically coupled to the source terminals of the transistors 114a and 124a, and the conductive line 364 is electrically coupled to the source terminals of the transistors 114b and 124b.

The conductive lines 365 and 366 are usable as the first data line 252 and the first complementary data line 254, and the conductive lines 367 and 368 are usable as the second data line 262 and the second complementary data line 264. Each of the conductive lines 365, 366, 367, and 368 is connected to a corresponding one of the source/drain terminals of switches 132, 134, 136, and 138. The conductive lines 369 are usable to connect the gate terminals of the switches 132, 134, 136, and 138 to the word lines 256 and 266, which are to be formed at yet another layer of interconnection structure over conductive lines 362, 363, 364, 365, 366, 367, 368, and 369.

In accordance with some embodiments, a memory cell includes a first data node, a first complementary data node, a second data node, a second complementary data node, and a first, second, and third columns of devices. The first column of devices includes a first pull-down transistor, a second pull-down transistor, a first switch, and a second switch. The second column of devices includes a third pull-down transistor, a fourth pull-down transistor, a third switch, and a fourth switch. The third column of devices includes a first pull-up transistor, and a second pull-up transistor. The first pull-up transistor, the first pull-down transistor, and the third pull-down transistor are connected as a first inverter, and the first inverter have a first output terminal. The second pull-up transistor, the second pull-down transistor, and the fourth pull-down transistor are connected as a second inverter, and the second inverter have a second output terminal. The first inverter and the second inverter are cross-coupled. The first switch, the second switch, the third switch, and the fourth switch are arranged to respectively couple: (1) the first output terminal with the first data node; (2) the first output terminal with the second data node; (3) the second output terminal with the first complementary data node; and (4) the second output terminal with the second complementary data node.

In accordance with some embodiments, a memory array includes a first memory cell and a second memory cell aligned along a column direction. Each of the first memory cell and the second memory includes a pair of cross-coupled inverters, a first switch and a second switch each on one side of the pair of cross-coupled inverters, and a third switch and a fourth switch each on one side of the pair of cross-coupled inverters. The pair of cross-coupled inverters has a first output terminal and a second output terminal. The first switch and a second switch are electrically coupled to either the first output terminal or the second output terminal, respectively. The third switch and a fourth switch are electrically coupled to either the first output terminal or the second output terminal, respectively. The memory array also includes a first data line, a first complementary data line, a second data line, and a second complementary data line along a column direction and over the switches.

In accordance with some embodiments, a memory cell includes a substrate including a first active region, a second active region, and a third active region, a first pull-down transistor, a second pull-down transistor, a first switch, and a second switch positioned at the first active region and aligned along a column direction, a third pull-down transistor, a fourth pull-down transistor, a third switch, and a fourth switch positioned at the second active region and aligned along the column direction, and a first pull-up transistor and a second pull-up transistor positioned at the third active region. The first pull-up transistor, the first pull-down transistor, and the third pull-down transistor are connected as a first inverter, and the first inverter has a first output terminal. The second pull-up transistor, the second pull-down transistor, and the fourth pull-down transistor are connected as a second inverter, and the second inverter has a second output terminal. The first inverter and the second inverter are cross-coupled. Each of the first switch, the second switch, the third switch, and the fourth switch is electrically coupled to either the first output terminal or the second output terminal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
a first data node, a first complementary data node, a second data node, and a second complementary data node;
a first pull-down transistor, a second pull-down transistor, a first switch, and a second switch aligned as a first column of devices along a first direction;
a third pull-down transistor, a fourth pull-down transistor, a third switch, and a fourth switch aligned as a second column of devices along the first direction; and
a first pull-up transistor and a second pull-up transistor aligned as a third column of devices along the first direction,
the first pull-up transistor, the first pull-down transistor, and the third pull-down transistor being connected as a first inverter, the first inverter having a first output terminal,
the second pull-up transistor, the second pull-down transistor, and the fourth pull-down transistor being connected as a second inverter, the second inverter having a second output terminal,
the first inverter and the second inverter being cross-coupled, and
the first switch, the second switch, the third switch, and the fourth switch being arranged to respectively couple:
(1) the first output terminal with the first data node;
(2) the first output terminal with the second data node;
(3) the second output terminal with the first complementary data node; and
(4) the second output terminal with the second complementary data node.

2. The memory cell of claim 1, wherein:
the first switch and the third switch are arranged to respectively couple the first output terminal with the first data node and the second output terminal with the first complementary data node; and
the second switch and the fourth switch are arranged to respectively couple the first output terminal with the second data node and the second output terminal with the second complementary data node.

3. The memory cell of claim 1, wherein the third column of devices is positioned between the first column of devices and the second column of devices.

4. The memory cell of claim 1, wherein the first pull-up transistor, the first pull-down transistor, and the third pull-down transistor are arranged as a first row of devices along a second direction, and the second pull-up transistor, the second pull-down transistor, and the fourth pull-down transistor are arranged as a second row of devices along the second direction.

5. The memory cell of claim 4, wherein the first switch and the third switch are arranged as a third row of devices along the second direction, and the second switch and the fourth switch are arranged as a fourth row of devices along the second direction.

6. The memory cell of claim 1, wherein the first pull-down transistor, the second pull-down transistor, the first switch, and the second switch are positioned at a first active region of a substrate, and the third pull-down transistor, the fourth pull-down transistor, the third switch, and the fourth switch are positioned at a second active region of the substrate.

7. The memory cell of claim 6, wherein the first pull-up transistor and the second pull-up transistor are positioned at a third active region of the substrate.

8. The memory cell of claim 1, further comprising:
a first power line along the first direction and over the first pull-up transistor and the second pull-up transistor;
a second power line along the first direction and over the first pull-down transistor, the second pull-down transistor, the first switch, and the second switch;
a third power line along the first direction and over the third pull-down transistor, the fourth pull-down transistor, the third switch, and the fourth switch;
a first data line along the first direction and between the first power line and the second power line; and
a second data line along the first direction and between the first power line and the third power line.

9. A memory cell, comprising:
a substrate including a first active region, a second active region, and a third active region;
a first pull-down transistor, a second pull-down transistor, a first switch, and a second switch positioned at the first active region and aligned along a column direction;
a third pull-down transistor, a fourth pull-down transistor, a third switch, and a fourth switch positioned at the second active region and aligned along the column direction; and
a first pull-up transistor and a second pull-up transistor positioned at the third active region,
the first pull-up transistor, the first pull-down transistor, and the third pull-down transistor being connected as a first inverter, the first inverter having a first output terminal,
the second pull-up transistor, the second pull-down transistor, and the fourth pull-down transistor being connected as a second inverter, the second inverter having a second output terminal,
the first inverter and the second inverter being cross-coupled, and
each of the first switch, the second switch, the third switch, and the fourth switch being electrically coupled to either the first output terminal or the second output terminal.

10. The memory cell of claim 9, wherein:
the first switch and the third switch are arranged to couple with the corresponding first output terminal and the second output terminal, and
the second switch and the fourth switch are arranged to couple with the corresponding first output terminal and the second output terminal.

11. The memory cell of claim 9, wherein the first pull-up transistor and the second pull-up transistor are aligned along the column direction.

12. The memory cell of claim 9, wherein the third active region is positioned between the first active region and the second active region.

13. A memory cell, comprising:
a first inverter having a first output terminal, the first inverter comprising a first pull-up transistor, a first pull-down transistor, and a second pull-down transistor;
a second inverter having a second output terminal, the second inverter comprising a second pull-up transistor, a third pull-down transistor, and a fourth pull-down transistor, the first inverter and the second inverter being cross-coupled;
a first switch and a second switch coupled to the first output terminal; and
a third switch and a fourth switch coupled to second output terminal;
the first pull-down transistor, the second pull-down transistor, and two of the first, the second, the third, and the fourth switches being aligned as a first column of devices along a first direction, the third pull-down transistor, the fourth pull-down transistor, and the other two of the first, the second, the third, and the fourth switches being aligned as a second column of devices along the first direction, and the first pull-up transistor and the second pull-up transistor being aligned as a third column of devices along the first direction.

14. The memory cell of claim 13, wherein the third column of devices is positioned between the first column of devices and the second column of devices.

15. The memory cell of claim 13, wherein the first pull-up transistor, the first pull-down transistor, and the third pull-down transistor are arranged as a first row of devices along a second direction, and the second pull-up transistor, the second pull-down transistor, and the fourth pull-down transistor are arranged as a second row of devices along the second direction.

16. The memory cell of claim 15, wherein the first switch and the third switch are arranged as a third row of devices along the second direction, and the second switch and the fourth switch are arranged as a fourth row of devices along the second direction.

17. The memory cell of claim 13, wherein the first pull-down transistor, the second pull-down transistor, the first switch, and the second switch are positioned at a first active region of a substrate, and the third pull-down transistor, the fourth pull-down transistor, the third switch, and the fourth switch are positioned at a second active region of the substrate.

18. The memory cell of claim 17, wherein the first pull-up transistor and the second pull-up transistor are positioned at a third active region of the substrate.

19. The memory cell of claim 13, further comprising:
a first power line along the first direction and over the first pull-up transistor and the second pull-up transistor;
a second power line along the first direction and over the first pull-down transistor, the second pull-down transistor, the first switch, and the second switch;
a third power line along the first direction and over the third pull-down transistor, the fourth pull-down transistor, the third switch, and the fourth switch;
a first data line along the first direction and between the first power line and the second power line; and
a second data line along the first direction and between the first power line and the third power line.

20. A memory, comprising:
a pair of cross-coupled inverters having a first output terminal and a second output terminal;
a first switch on a first side, along a column direction, of the pair of cross-coupled inverters and electrically coupled to either the first output terminal or the second output terminal;
a second switch aligned with the first switch along the column direction, on a second side of the pair of cross-coupled inverters opposing to the first side, and electrically coupled to either the first output terminal or the second output terminal;
a third switch on the first side of the pair of cross-coupled inverters and electrically coupled to either the first output terminal or the second output terminal;
a fourth switch aligned with the third switch along the column direction, on the second side of the pair of cross-coupled inverters, and electrically coupled to either the first output terminal or the second output terminal;
a first data line along the column direction and over the first switch and the second switch;
a first complementary data line along the column direction and over the third switch and the fourth switch;
a second data line along the column direction and over the first switch and the second switch; and
a second complementary data line along the column direction and over the third switch and the fourth switch.

21. The memory of claim 20, wherein:
the first data line is electrically coupled to the first switch,
the first complementary data line is electrically coupled to the third switch,
the second data line is electrically coupled to the second switch, and
the second complementary data line is electrically coupled to the fourth switch.

22. The memory of claim 20, further comprising:
a first power line along the column direction and between the first data line and the first complementary data line.

23. The memory of claim 22, further comprising:
a second power line along the column direction and between the first data line and the second data line; and
a third power line along the column direction and between the first complementary data line and the second complementary data line.

24. The memory of claim 20, further comprising:
a first word line along a row direction and electrically coupled to the first switch; and
a second word line along the row direction and electrically coupled to the second switch.

25. The memory of claim 20, wherein the pair of cross-coupled inverters comprises:
a first inverter including a first pull-up transistor, a first pull-down transistor, and a second pull-down transistor; and
a second inverter including a second pull-up transistor, a third pull-down transistor, and a fourth pull-down transistor.

26. The memory of claim 25, wherein:
the first pull-down transistor, the third pull-down transistor, the first switch, and the second switch are aligned along the column direction, and
the second pull-down transistor, the fourth pull-down transistor, the third switch, and the fourth switch are aligned along the column direction.

27. The memory of claim 25, wherein the first pull-up transistor and the third first pull-up transistor are aligned along the column direction.

* * * * *